(12) United States Patent
Kwak et al.

(10) Patent No.: US 12,707,772 B2
(45) Date of Patent: Aug. 11, 2026

(54) DISPLAY DEVICE AND MANUFACTURING METHOD THEREOF

(71) Applicant: LG DISPLAY CO., LTD., Seoul (KR)

(72) Inventors: Yong Seok Kwak, Paju-si (KR); Min Jae Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 573 days.

(21) Appl. No.: 17/919,727

(22) PCT Filed: Apr. 30, 2021

(86) PCT No.: PCT/KR2021/005499
§ 371 (c)(1),
(2) Date: Oct. 18, 2022

(87) PCT Pub. No.: WO2022/005005
PCT Pub. Date: Jan. 6, 2022

(65) Prior Publication Data

US 2023/0238491 A1 Jul. 27, 2023

(30) Foreign Application Priority Data

Jun. 30, 2020 (KR) ........................ 10-2020-0080152

(51) Int. Cl.

| | |
|---|---|
| ***H10H 20/851*** | (2025.01) |
| ***H10D 86/40*** | (2025.01) |
| ***H10D 86/60*** | (2025.01) |
| ***H10H 20/822*** | (2025.01) |
| ***H10H 20/857*** | (2025.01) |
| ***H10H 29/01*** | (2025.01) |

(Continued)

(52) U.S. Cl.
CPC ...... *H10H 20/8512* (2025.01); *H10D 86/441* (2025.01); *H10D 86/60* (2025.01); *H10H 20/8514* (2025.01); *H10H 20/857* (2025.01); *H10W 90/00* (2026.01); *H10H 20/0361* (2025.01); *H10H 20/0364* (2025.01)

(58) Field of Classification Search
CPC ........... H10H 20/8512; H10H 20/0361; H10H 29/8552; H10H 20/812; H01L 25/167
See application file for complete search history.

(56) References Cited

U.S. PATENT DOCUMENTS 10,090,335 B2 10/2018 Kang et al.
10,325,936 B2 * 6/2019 Kang .................. H10H 20/831

(Continued)

FOREIGN PATENT DOCUMENTS

CN 106684108 A 5/2017
CN 108022940 A 5/2018

(Continued)

OTHER PUBLICATIONS

Dictionary definition of covering as defined in the Collins dictionary.*

(Continued)

*Primary Examiner* — Monica D Harrison
*Assistant Examiner* — Jacob T Nelson
(74) *Attorney, Agent, or Firm* — Fenwick & West LLP

(57) ABSTRACT

A display device according to an embodiment of the present invention comprises a color conversion substrate and a color conversion layer which convert light of a first color emitted by an LED to a second color and emit the light in all directions.

19 Claims, 17 Drawing Sheets

(51) Int. Cl.

| | |
|---|---|
| ***H10H 29/855*** | (2025.01) |
| ***H10W 90/00*** | (2026.01) |
| *H10H 20/01* | (2025.01) |

(56) References Cited

U.S. PATENT DOCUMENTS

| | | | |
|---|---|---|---|
| 11,942,583 B2 | 3/2024 | Itou et al. | |
| 11,996,437 B2 | 5/2024 | Itou et al. | |
| 2006/0240286 A1* | 10/2006 | Park | G02F 1/133617 428/690 |
| 2014/0021503 A1* | 1/2014 | Yoshida | H10H 20/8581 977/774 |
| 2014/0367633 A1* | 12/2014 | Bibl | H10H 20/8515 257/13 |
| 2015/0362165 A1 | 12/2015 | Chu et al. | |
| 2016/0190500 A1 | 6/2016 | Watabe et al. | |
| 2017/0115561 A1* | 4/2017 | Yang | G03F 7/0007 |
| 2018/0122836 A1* | 5/2018 | Kang | H10H 20/8514 |
| 2020/0013766 A1 | 1/2020 | Kim | |
| 2020/0212267 A1* | 7/2020 | Kwak | H10H 20/819 |
| 2021/0265420 A1 | 8/2021 | Itou et al. | |
| 2021/0265540 A1 | 8/2021 | Itou et al. | |

FOREIGN PATENT DOCUMENTS

| | | | |
|---|---|---|---|
| EP | 3316301 A1 | 5/2018 | |
| EP | 3553821 A1 | 10/2019 | |
| JP | 2020-080361 A | 5/2020 | |
| KR | 10-2008-0089519 A | 10/2008 | |
| KR | 10-2013-0137985 A | 12/2013 | |
| KR | 10-2017-0117282 A | 10/2017 | |
| KR | 10-2018-0046494 A | 5/2018 | |
| KR | 10-2019-0085892 A | 7/2019 | |
| KR | 10-2019-0099149 A | 8/2019 | |
| WO | WO 2017/007770 A2 | 1/2017 | |
| WO | WO 2020/100407 A1 | 5/2020 | |
| WO | WO-2020100432 A1 * | 5/2020 | H10H 20/8512 |

OTHER PUBLICATIONS

Dictionary definition of covering as defined in the Merriam-webster dictionary.*

European Patent Office, Extended European Search Report, European Patent Application No. 21833230.2, Jul. 23, 2024, 10 pages.

Korean Intellectual Property Office, Office Action, Korean Patent Application No. 10-2020-0080152, Jan. 17, 2025, 13 pages.

PCT International Search Report and Written Opinion, PCT Application No. PCT/KR2021/005499, Aug. 6, 2021, 7 pages (with English translation of PCT International Search Report).

China National Intellectual Property Administration, Office Action, Chinese Patent Application No. 202180029575.4, Jan. 9, 2026, 10 pages.

* cited by examiner

DISPLAY DEVICE AND MANUFACTURING METHOD THEREOF

TECHNICAL FIELD

The present disclosure relates to a display device, and more particularly, to a display device which converts a color of light emitted from an LED into a specific color and emits the light.

BACKGROUND ART

Following a Liquid Crystal Display Device (LCD), which is used so far, use and application ranges of an Organic Light Emitting Display Device (OLED) are gradually expanding.

In order to implement an image, a plurality of light emitting elements and liquid crystals are disposed on a substrate on a display device, and a driving element supplying a driving signal to individually control operations of respective light emitting elements and liquid crystals is disposed jointly with the light emitting element to display the plurality of light emitting elements and the liquid crystals disposed on the substrate according to information to be displayed.

Since the liquid crystal display device is not a self-luminous scheme, a backlight unit disposed on a rear surface of the liquid crystal display device for emitting light is required. The backlight unit has a restriction in increasing a thickness of the liquid crystal display device, and implementing the display device with various types of designs such as flexible or circular, and luminance and a response speed of the backlight unit may be reduced.

Meanwhile, since the display device with the self-luminous element may be implemented thinner than a display device a light source embedded therein, a display device which is flexible and foldable can be implemented. The display device with the self-luminous element may be an organic light emitting display device containing an organic matter as an active layer, and since the organic light emitting display device does not require a separate light source by self-light emitting, the organic light emitting display device can be used as thinner and various types of display devices.

However, in the organic light emitting display device using the organic matter, since bad pixels are easily generated due to an oxidation phenomenon between an organic active layer and an electrode by penetration of moisture and oxygen, various technical configurations for minimizing the penetration of the oxygen and the moisture are additionally required.

Therefore, in recent years, in order to overcome the problems of the liquid crystal display device and/or the organic light emitting display device, an LED display device using a light emitting diode (LED) as the light emitting element has been proposed.

The display device as a display device in which a mini or micro sized subminiature LED using an inorganic matter as the light emitting element in a subpixel may implement a high-definition image by using the inorganic matter as the light emitting element, and implement a high-reliability and long-lifespan display device resistant to a defect such as moisture penetration.

In general, the LED display device is implemented by growing the LED on a sapphire substrate, separating the LED from the sapphire substrate, and transferring the LED to a transistor substrate.

In this case, a size of the LED is very small and difficulties of separation and transfer processes of the LED are high, so there is a problem in that it is difficult to enhance accuracy and yield of the process.

Further, light generated from the LED proceeds in omni directions including an upper portion, a lateral portion, and a lower portion, but only light radiated to the upper portion is expressed to the outside to display the image, and light in remaining directions is destroyed in the display device, so light emitting efficiency decreases.

DISCLOSURE

Technical Problem

The present disclosure is directed to providing a structure which is capable of enhancing luminous efficiency of a display device using an LED, and simplifying a transfer process.

Objects of the present disclosure are not limited to the above-mentioned objects, and other objects, which are not mentioned above, can be clearly understood by those skilled in the art from the following descriptions.

Technical Solution

One aspect of the present disclosure provides a display device which may be configured to include: a first color conversion layer having a thin-film transistor and an LED disposed on a substrate, and converting light of a first color emitted from the LED into a second color. In addition, the first color conversion layer includes a nano fluorescent body made of an inorganic material to absorb light of a specific wavelength emitted from the LED and emit light of another wavelength omnidirectionally. Therefore, light emitted from a blue LED and radiated toward a lateral surface may be absorbed by the first color conversion layer and converted into red light, and emitted upward to increase luminous efficiency.

In addition, when the first color conversion layer converting blue light into the red light is applied, the blue LED may be transferred to a blue subpixel area and a red subpixel area at once. A process of transferring an existing red LED to a red subpixel may be omitted, so there is an advantage in terms of manufacturing cost reduction and yield. Further, a first red color conversion layer transferring the blue LED to the red subpixel area, the blue subpixel area, and a green subpixel area, and converting the blue light into the red light, and a first green color conversion layer converting the blue light into green light may also be applied.

In addition, a color conversion substrate may be disposed on a display substrate. The color conversion substrate which absorbs light which is not absorbed by the first color conversion layer but passes through the first color conversion layer and emits the absorbed light, may perform the same function as the first color conversion layer.

The color conversion substrate may be configured by configuring a second color conversion layer at a position corresponding to the first color conversion layer, and arranging a transparent film at an upper portion of the second color conversion layer, and arranging an adhesive layer at a lower portion. The color conversion substrate may be attached onto the first color conversion layer by the adhesive layer at the lower portion.

Other detailed matters of the exemplary embodiments are included in the detailed description and the drawings.

Advantageous Effects

According to an example embodiment of the present disclosure, a first color conversion layer surrounding an LED and a second color conversion layer at a position corresponding to the first conversion layer are disposed to reuse LED light radiated toward both sides, thereby enhancing luminous efficiency.

Further, according to an example embodiment of the present disclosure, an LED transfer process is reduced to decrease manufacturing cost and enhance yield.

MODES OF THE INVENTION

Figure 1A:
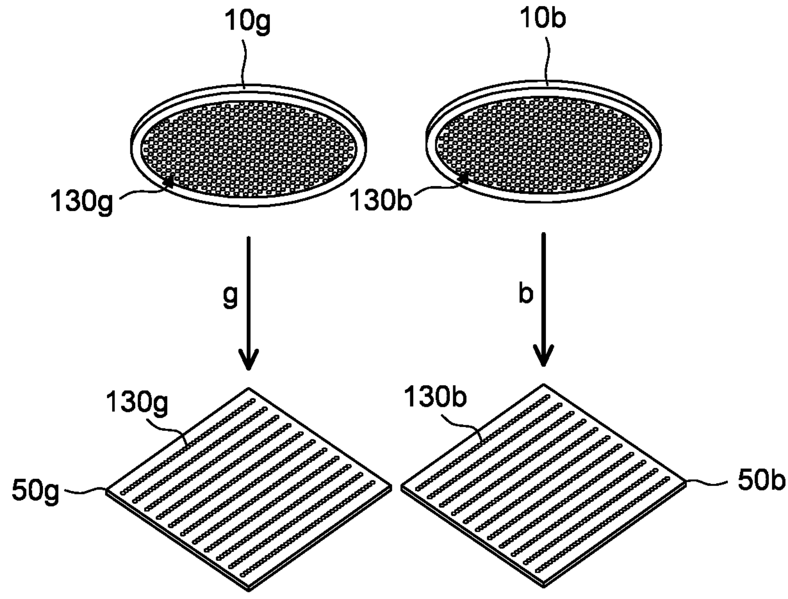
FIG. 1A is a diagram illustrating primary transfer for implementing a display device according to an example embodiment of the present disclosure.

Detailed contents for achieving the present disclosure will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

A display device in the present disclosure may be applied to an LED display device, but is not limited thereto and may be applied to various display devices.

Hereinafter, a light emitting display device according to exemplary embodiments of the present disclosure will be described in detail with reference to accompanying drawings.

Figure 1B:
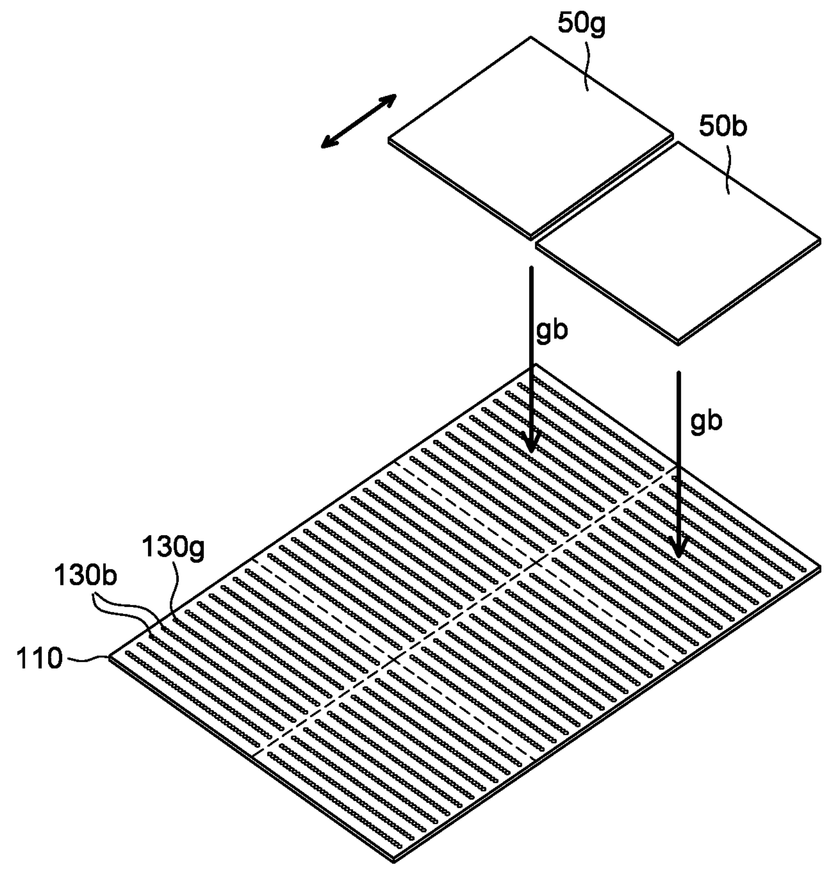
FIG. 1B is a diagram illustrating secondary transfer for implementing a display device according to an example embodiment of the present disclosure.

FIGS. 1A and 1B illustrate a transfer method of an LED 130 disposed on a display substrate 110 and used as a subpixel according to an example embodiment of the present disclosure. Here, the LED 130 means all LEDs 130 used in the display device according to the example embodiment of the present disclosure. That is, the LED 130 includes both a blue LED 130*b* and a green LED 130*g*.

In order to transfer the LED 130 onto the display device 110, wafers 10*g* and 10*b* such as sapphire or silicon are prepared, and then an n-type electrode, an n-type layer, an active layer of a multi-quantum well structure, a p-type layer, and a p-type electrode are sequentially grown on the wafers 10*g* and 10*b* by an epitaxial growth method by metal organic chemical vapor deposition (MOCVD) to form a green LED 130*g* and the blue LED 130*b*. That is, the green LED 130*g* is formed in a green wafer 10*g* and the blue LED 130*b* is formed in the blue wafer 10*b*. The green LED 130*g* and the blue LED 130*b* formed in the wafers 10*g* and 10*b*, respectively are primarily transferred to donor substrates 50*g* and 50*b*, respectively.

Next, referring to FIG. 1B, each of the green LED 130*g* and the blue LED 130*b* transferred to the donor substrates 50*g* and 50*b*, respectively is secondarily transferred to one display substrate) 10 in which a thin film transistor and various wires are formed, and the LED is connected the thin film transistor and a common wire by a connection wire to manufacture the display device.

As described above, the display device of the present disclosure may be formed by separately manufacturing the display substrate 110 in which the thin film transistor and various wires are formed, and the LED 130, and then transferring the manufactured LED 130 to the display substrate 110. That is, a plurality of LEDs 130 is manufactured on the wafer 10 made of sapphire or silicon and primarily transferred to the donor substrate 50, and secondary transferred to the display substrate 110 from the donor substrate 50 to complete the display device.

Each LED 130 transferred onto the display substrate 110 is transferred to a subpixel area constituting one pixel to become the subpixel. The subpixel area is an area in which the LED used as the subpixel, and a driving circuit are disposed, and the example embodiment of the present disclosure includes a red subpixel area, a green subpixel area, and a blue subpixel area. Various colors of light may be emitted from one pixel by a combination of the plurality of subpixels, and the plurality of pixels is combined to display various images.

Figure 4:
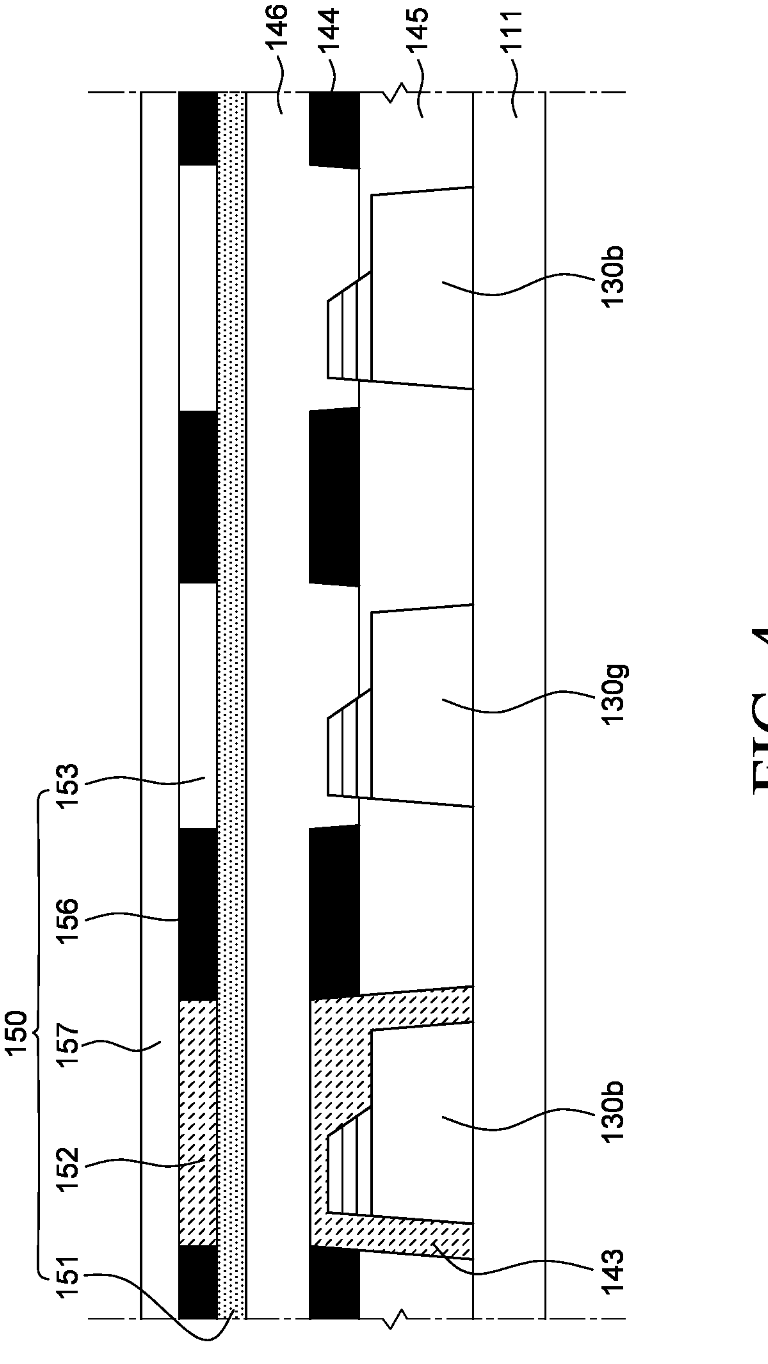
FIG. 4 is a cross-sectional view illustrating one pixel configuration according to an example embodiment of the present disclosure.

Referring to FIGS. 1B and 4, a plurality of green LEDs 130*g* and blue LEDs 130*b* are transferred onto the display substrate 110. Specifically, the plurality of green LEDs 130*g* is transferred to a green subpixel area and the plurality of blue LEDs 130*b* is transferred to a blue subpixel area and a red subpixel area. In the case of a transfer order, the green LED may be first transferred to the green subpixel area, and then the blue LED may be simultaneously transferred to the blue subpixel area and the red subpixel area, and it is also possible that the LEDs are transferred in a reverse order.

When the plurality of blue LEDs is transferred to the blue subpixel area and the red subpixel area at once, an existing process of transferring the red LED to the red subpixel area may be omitted, so there is an advantage in terms of manufacturing cost reduction and yield.

Figure 5:
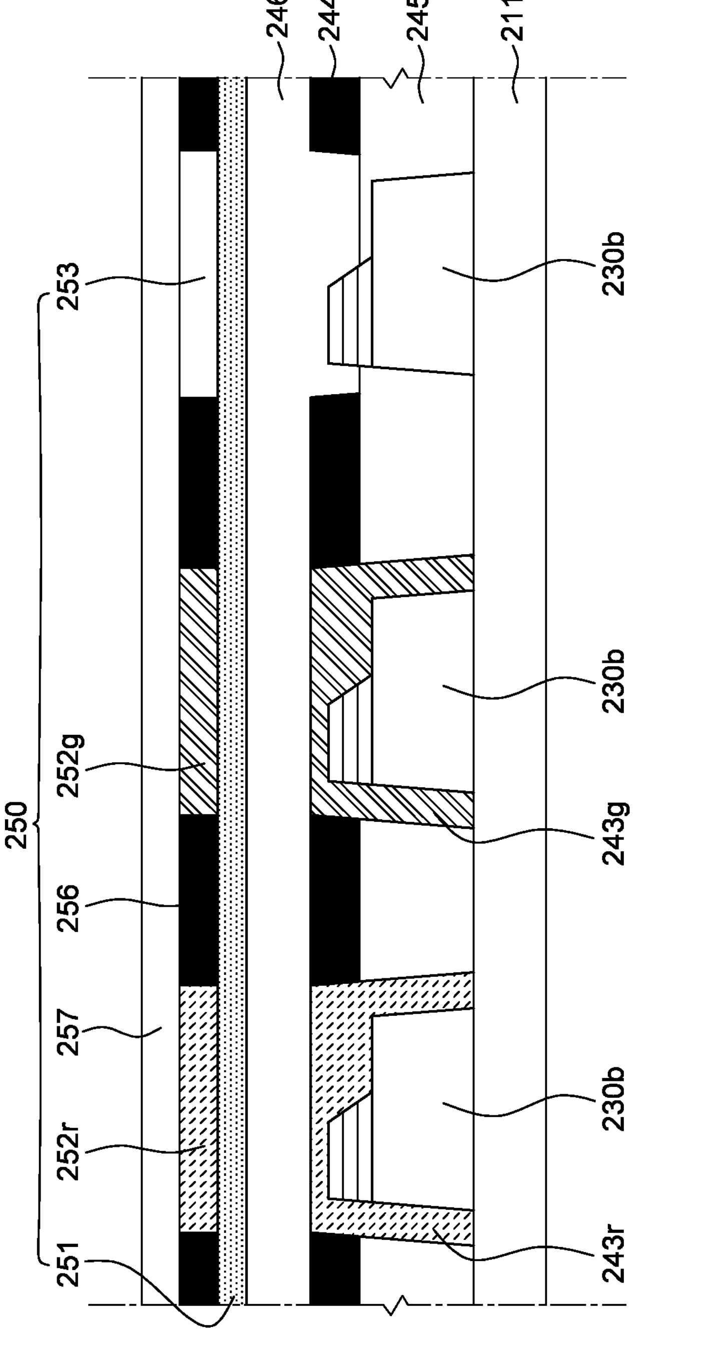
FIG. 5 is a cross-sectional view illustrating one pixel configuration according to another example embodiment of the present disclosure.

Further, as illustrated in FIG. 5, when the plurality of blue LEDs 230*b* is transferred to the red subpixel area, the blue subpixel area, and the green subpixel area, the existing processes of transferring the green LED and the red LED may be all omitted, so there are more advantages.

As such, in order to reduce the transfer process, a color conversion layer for converting blue light emitted from the plurality of blue LEDs 130*b* into red light or green light should be additionally configured.

Figure 2:
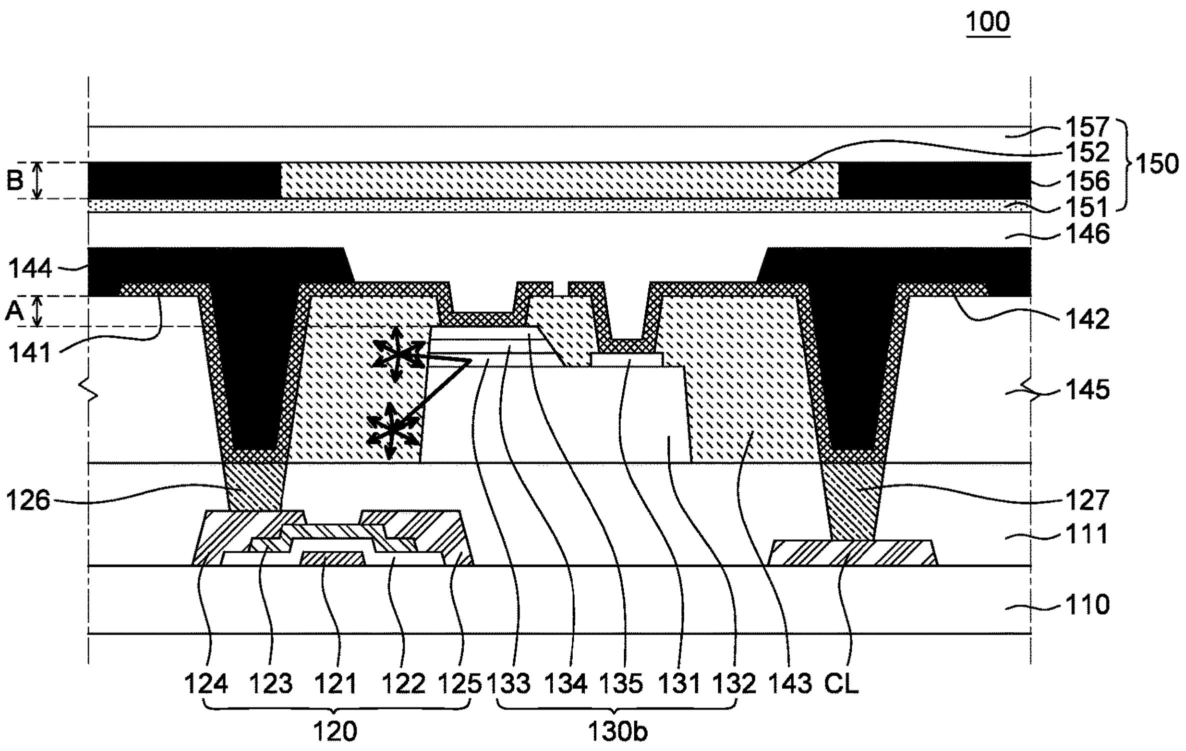
FIG. 2 is a cross-sectional view specifically illustrating a structure of a display device according to an example embodiment of the present disclosure.

FIG. 2 is a cross-sectional view illustrating a structure of a display device including a color conversion layer according to an example embodiment of the present disclosure.

Referring to FIG. 2, a blue LED 130*b*, a first color conversion layer 143, and a second color conversion 152 are disposed in a red emitting area of the display device 100. Specific contents of the color conversion layer will be described below, and first, a driving circuit and the LED 130*b* disposed at a lower portion and a lateral portion of the blue LED 130*b* will be described in detail.

The driving circuit may be disposed at the upper portion or the lower portion of the display substrate 110, and the driving circuit may be constituted by a plurality of thin-film transistors 120 and a capacitor (not illustrated). The plurality of thin-film transistors 120 may be constituted by a switching thin-film transistor and a driving thin-film transistor.

The thin-film transistor 120 is constituted by a gate electrode 121, an active layer 123, a source electrode 124, and a drain electrode 125. Specifically, the gate electrode 121 is disposed on the substrate 110, and the active layer 123 is disposed on the gate electrode 121. A gate insulating layer 122 for insulating the gate electrode 121 and the active layer 123 is disposed between the gate electrode 121 and the active layer 123. The source electrode 124 and the drain electrode 125 are disposed on the active layer 123.

In FIG. 2, a bottom gate type thin-film transistor is illustrated as described above, but the example embodiment of the present disclosure is not limited thereto. For example, thin-film transistors having various structures such as a top gate type thin-film transistor may be adopted in addition to the bottom gate type.

A common wire CL is disposed on a lateral surface of the thin-film transistor 120 with a material which is the same as a gate electrode material or a source electrode/drain electrode material.

The common wire CL transfers commonly used first power voltage Vss to the LED 130. Specifically, the common wire CL transfers the first power voltage Vss to an n-type electrode of the LED 130 to be described below.

In addition, a first planarization layer 111 for protecting and planarizing the thin-film transistor 120 is disposed on the source electrode 124, the drain electrode 125, and the common wire CL.

In addition, the LED 130 is disposed on the first planarization layer 111 through the transfer process described in FIGS. 1A and 1B.

Hereinafter, the LED 130 will be described in detail.

The LED 130 includes an n-type electrode 131, an n-type layer 132, an active layer 133, a p-type layer 134, and a p-type electrode 135. A detailed layout structure of the LED 130 as a structure in which the n-type electrode 131 and the active layer 133 are located at the upper portion of the n-type layer 132 and the p-type layer 134 and the p-type electrode 135 are sequentially located at the upper portion of the active layer 133 is a structure of a lateral type LED. Hereinafter, it will be described that the structure of the LED 130 is the lateral type, but the structure of the LED 130 is not limited thereto and it is also possible that the structure of the LED 130 is a vertical or flip type. In addition, the LED 130 may be a micro LED (a chip size is 100 μm) or less) or a mini LED (the chip size is hundreds of μm).

The p-type electrode 135 located on a top layer among components of the LED 130 is connected to the source electrode 124 of the thin-film transistor 120 to be applied with second power voltage Vdd according to data voltage. The second power voltage Vdd provides a positive load to the p-type electrode 135.

The p-type layer 134 located at the lower portion of the p-type electrode 135 as a semiconductor layer which receives holes from the p-type electrode 135, and generates current by movement of holes having a positive potential as carriers may be made of a p-GaN based material. The p-GaN based material may be GaN, AlGaN, InGaN, AlInGaN, etc., and as impurities used for doping the p-type semiconductor layer, Mg, Zn, Be, etc., may be used.

The active layer 133 is disposed at the lower portion of the p-type layer 134. The active layer 133 may be disposed on the n-type layer 132, and may have a multi quantum well (MQW) structure having a well layer and a barrier layer higher than the well layer by a band gap. For example, the active layer 133 may have the multi quantum well structure such as AlGaInP, GaInP, InGaN, and GaN.

The n-type layer 132 located at the lower portion of the active layer 133 as a semiconductor which is supplied with electrons from the n-type electrode 131 and generates current by movement of free electrons having a negative charge as the carriers may be made of an n-GaN based material. The n-GaN based material may be GaN, AlGaN, InGaN, AlInGaN, etc., and as impurities used for doping the n-type semiconductor layer, Si, Ge, Se, Te, C, etc., may be used. The n-type layer protrudes to the outside of the active layer. In other words, the active layer 133 and the p-type layer 134 may have a smaller area than the n-type layer 132 so as to expose an upper surface of the n-type layer 132.

The n-type electrode 131 is disposed at a portion protruded to the outside of the active layer 133 in the n-type layer 132. The n-type electrode 131 is connected to the common wire CL to be applied with the first power voltage Vss. The common wire CL is commonly connected to each LED 130 to apply predetermined voltage. The common wire CL provides the negative load to the n-type electrode 131.

As described above, the LED 130 may be used as the plurality of subpixels, and the LED 130 may be constituted by the green LED **130*g* and the blue LED 130*b***. In order for respective LEDs to emit different colors, the n-type layer, the active layer, and the p-type layer of the LED should be configured by different materials, and since different manufacturing processes are used, the manufacturing process is complicated.

Figure 3:
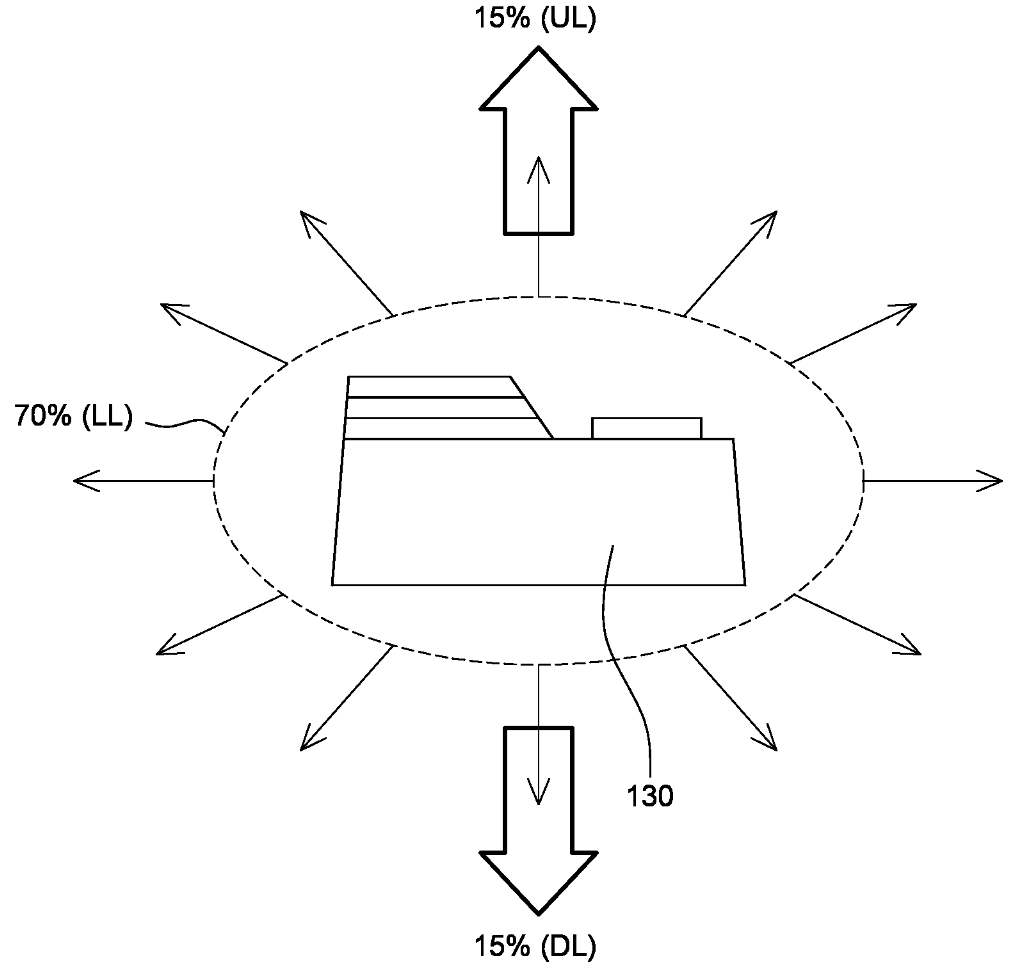
FIG. 3 is a diagram illustrating a light emitting ratio depending on a direction of an LED according to the present disclosure.

Meanwhile, referring to the LED light emitting ratio according to the direction of FIG. 3, the light generated from the LED 130 is omnidirectionally emitted toward the upper portion, the lower portion, and the lateral portion, and the light emitting ratio in each direction is emitted to each of the upper portion (UL) and the lower portion (DL) as 15%, and 70% is emitted to the lateral portion (LL) surrounding the LED. Only the light emitted to the upper portion among them is used for displaying, and the light emitted to the lateral portion and the lower portion is absorbed and destroyed by an internal component of the display device. That is, only the light of 15% radiated toward the upper portion in the light emitted from the LED is used for displaying the image.

Accordingly, in order to simplify the manufacturing process of the display device and reuse the light emitted to the lateral portion (LL) and destroyed in the light emitted from the LED, the color conversion layer according to the example embodiment of the present disclosure may be disposed.

Hereinafter, the color conversion layer will be described in detail with reference to FIG. 2.

Referring to FIG. 2, the color conversion layer may include a first color conversion layer 143 and a second color conversion layer 152. The first color conversion layer 143 surrounds the upper surface and the lateral surface of the blue LED **130*b* with a predetermined thickness, and serves to absorb light of a first color emitted from the blue LED 130*b*, convert the absorbed light of the first color into light of a second color, emit the converted light of the second color, and serves to absorb the light of the first color emitted from the blue LED 130*b* and block emitting the absorbed light to the outside. The second color conversion layer 152 is disposed at a position corresponding to the first color conversion layer 143, and serves to convert the light of the first color which is not converted by the first color conversion layer 143 or not absorbed and passes through the first color conversion layer 143** into the light of the second color, or absorb and destroy thereof.

Referring to FIG. 2, the first color conversion layer 143 may include a photo luminance (PL) material that absorbs the light of the first color, i.e., light of a first wavelength such as a nano fluorescent body, an organic fluorescent body, or a quantum dot, and emits the light of the second color, i.e., light of a second wavelength. The first color conversion layer 143 containing the photo luminance (PL) material may absorb blue light emitted from the blue LED **130*b*** and radiated to the lateral portion (LL) and emit the blue light in omnidirectional portions including the upper portion. That is, the light radiated toward the lateral portion, which is destroyed inside the existing display device is absorbed and emitted to the upper portion to increase the luminous efficiency.

Further, when the color conversion layer is applied, in which the photo luminance (PL) material is distributed, such as the nano fluorescent body, the organic fluorescent body, or the quantum dot, light of different colors may be emitted by using the blue LED **130*b*. For example, the red light may be emitted or the green light may be emitted by using the blue LED 130*b***. That is, when the color conversion layer is used, in an existing configuration using different LEDs for each subpixel, light of different colors may be emitted by using the same LED in two or more subpixels to reduce an LED transfer process as described above.

The nano fluorescent body included in the color conversion layer is constituted by an activator performing a light emitting function and a host material accommodating the activator. The activator may adopt europium (Eu), manganese (Mn), cerium (Ce), terbium (Tb), erbium (Er), strontium (Sr), or scandium (Sc), the host material may adopt a potassium (K) compound, a strontium (Sr) compound, a calcium (Ca) compound, a silicon (Si) compound, and a gallium (Ga) compound. By combining the materials, the nano fluorescent body may adopt $K_2SiF_6:Mn^{4+}$, $Sr_{1-x}Ca_xAlSiN_3:Eu^{2+}$, $CaAlSiN_3:Eu^{2+}$, $CaS:Eu^{2+}$, $Sr_2Si_5N_8:Eu^{2+}$, $(Sr,Ba)Si_2O_2N_2:Eu^{2+}$, $\alpha,\beta$-SiAlON:$Eu^{2+}$,GaS:$Eu^{2+}$, etc. The nano fluorescent body is manufactured with a diameter size of 100 nm to 1.5 um.

Specifically, the nano fluorescent body as the photo luminance (PL) material has all of optically transmissive, reflective, and absorptive characteristics, most absorbed wavelengths are converted into a color of another wavelength and is emitted omnidirectionally, and other absorbed light has a feature that the light is extinguished as heat.

In a manufacturing method of the first color conversion layer 143 surrounding the blue LED **130*b***, a color conversion material layer may be formed by laminating a photosensitive dry film in which the material such as the nano fluorescent body, the organic fluorescent body, or the quantum dot is distributed on the display substrate and the color conversion material layer formed in a remaining area other than an area surrounding the lateral surface of the LED may be removed and formed through a photolithography process. Alternatively, the nano fluorescent body is distributed to an acryl based or epoxy based solution and applied to the display substrate, and cured to form the color conversion material layer and form the color conversion material layer by the photolithography process. Specifically, as the material of the color conversion material layer, photo acryl in which the nano fluorescent body is distributed may be used.

Alternatively, a liquid color conversion material may be applied and cured only around the LED 130 by an inkjet printing scheme to form the first color conversion layer 143.

The second color conversion layer 152 formed in the color conversion substrate 150 may also be formed by the same method as the first color conversion layer 143, but a partition type second black matrix 156 is formed in the color conversion substrate 150, so the second color conversion layer 152 is formed by a method for filling a space between the second black matrices 156 by an inkjet printing scheme.

Meanwhile, the color conversion layer has characteristics in that a color conversion rate and a color absorption rate are shown differently according to the thickness of the color conversion layer or the concentration of the nano fluorescent body to derive and apply an optimal condition for the thickness and concentration of the color conversion layer. Here, the concentration means a ratio of the nano fluorescent body distributed in the liquid color conversion material for manufacturing the color conversions layer. The concentration is represented as wt % and the wt % means a weight of the nano fluorescent body distributed in a solution of 100 g.

Figure 6A:
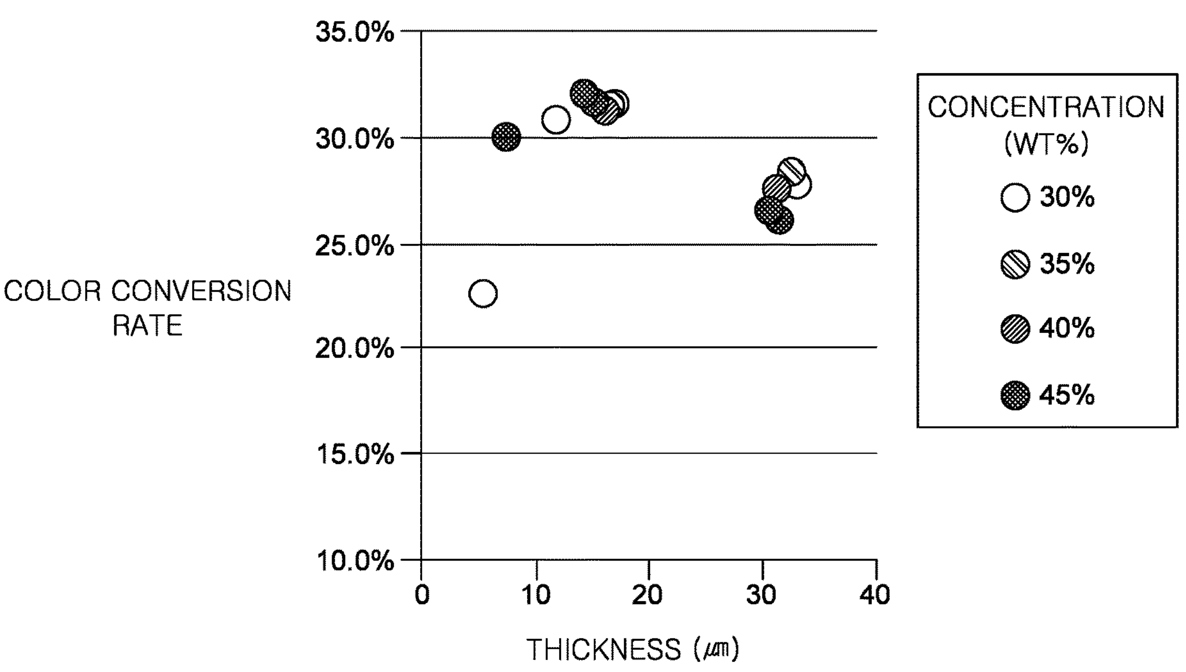
FIG. 6A is a diagram illustrating a conversion rate of converting blue light to red light according to a color conversion layer thickness and a nano fluorescent body concentration in a color conversion layer according to the present disclosure.

FIG. 6A is a diagram regarding a color conversion rate representing a ratio at which light of the blue LED 130*b* is converted into the red light in the color conversion layer according to the thickness of the color conversion layer and the concentration of the nano fluorescent body. An X axis of FIG. 6A indicates the thickness of the color conversion layer, and indicates a thickness (A+B) acquired by adding a first color conversion layer thickness A and a second color conversion layer 152 thickness B located at the upper portion of the LED in the first color conversion layer 143 of FIG. 2. A color conversion rate of a Y axis is a color conversion rate indicated when the nano fluorescent body concentration is changed to 30 wt %, 35 wt %, 40 wt %, and 45 wt %, and applied in each thickness while the color conversion layer thickness is changed to 1 to 40 μm.

Figure 6B:
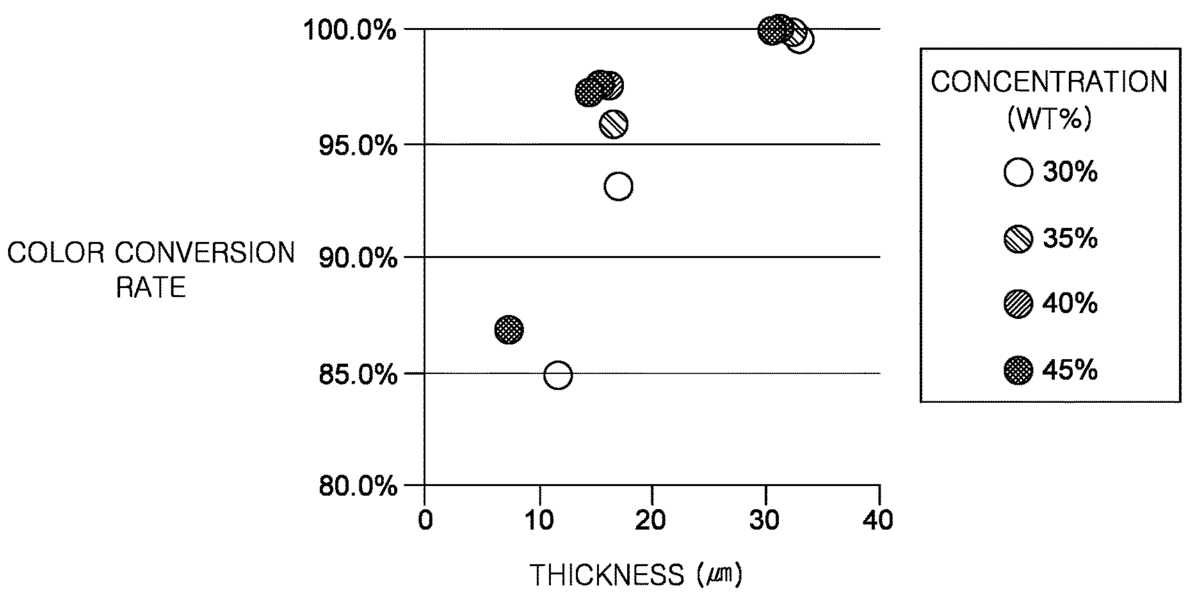
FIG. 6B is a diagram illustrating a blue light absorption rate changed according to the color conversion layer thickness and the nano fluorescent body concentration in the color conversion layer according to the present disclosure.

FIGS. 6A and 6B illustrate a result of preponderantly testing in a range in which an optimal result is determined to be derived based on existing data for efficient result derivation, and a result value in an entire range is omitted.

In FIG. 6A, when the thickness is 15 μm, the color conversion rate shows a highest color conversion rate value of 30% or more, and it is shown that there is not a large difference in color conversion rate according to the change in concentration of the nano fluorescent body.

FIG. 6B is a diagram regarding a color absorption rate representing a ratio at which the light of the blue LED 130*b* is absorbed by the color conversion layer according to the same thickness and concentration condition as in FIG. 6A. When the thickness is 30 μm or more, the color absorption rate is shown as 100%, and there is no large difference in color conversion rate according to the concentration change in the thickness of 30 μm or more. When the thickness is 15 μm, the color absorption rate is shown as 93% or more, and when the concentration is 40 wt %, the color absorption rate is shown as 97% or more.

Figure 6C:
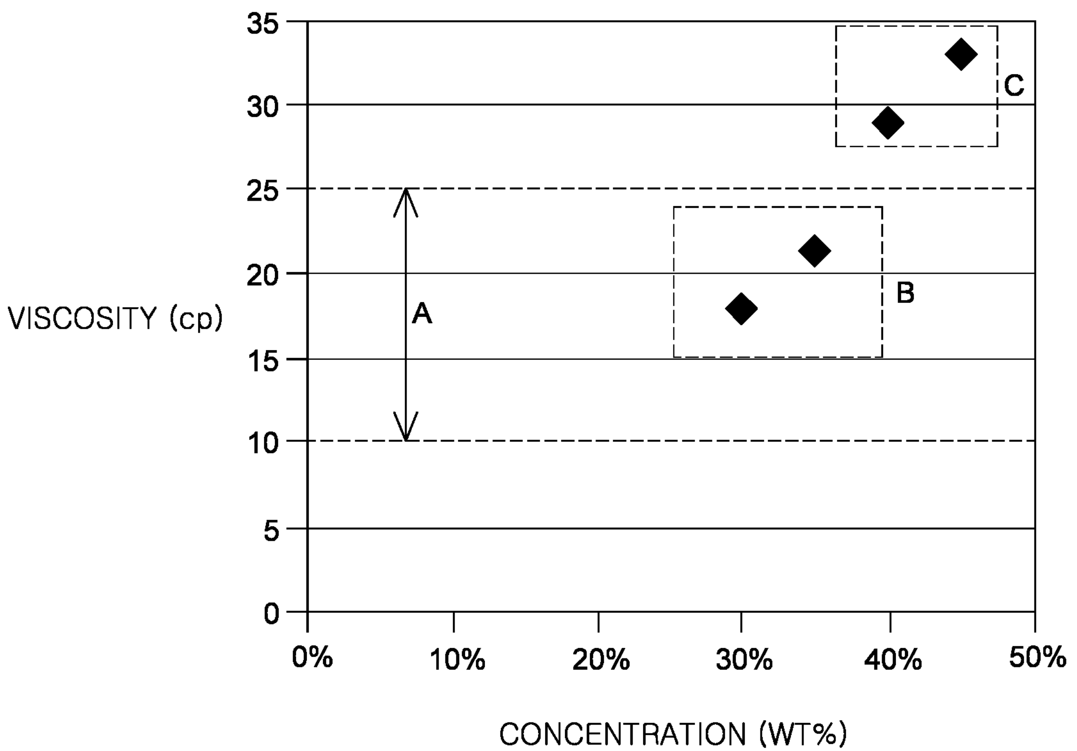
FIG. 6C is a diagram illustrating a viscosity of a color conversion material depending on the nano fluorescent body concentration according to the present disclosure.

FIG. 6C is a diagram illustrating a viscosity changed according to the concentration change. The X axis of FIG. 6C indicates the concentration (wt %) of the nano fluorescent body, and the Y axis indicates a viscosity (cp) according to the concentration change of the liquid color conversion material. FIG. 6C shows a feature that as the concentration is the lower, the viscosity is the lower and as the concentration is the higher, the viscosity is the higher. When the liquid color conversion material is discharged from a nozzle of an inkjet or dispenser device, the viscosity of the liquid color conversion material should have a viscosity of a predetermined level or more in order to prevent the liquid color conversion material from flowing down without being formed in the nozzle. Further, the liquid color conversion material should have a viscosity of a predetermined level or less so as to control the liquid color conversion material in a desired form in terms of the manufacturing process.

A range represented by A of FIG. 6C as an allowed viscosity of the liquid color conversion material has a range of 10 25 cp. The liquid color conversion material having the viscosity of the allowed range as 30 to 35 wt % is a range of B of FIG. 6C. In this case, the viscosity has 17 to 22 cp. The concentration of the color conversion material included in a range of C of FIG. 6C is 40 wt % or more and the viscosity which exceeds 25 cp and the color conversion material has a viscosity at which it is difficult to use the color conversion material in the manufacturing process.

Therefore, when the results of FIGS. 6A, 6B, and 6C are summarized, in terms of the color conversion rate, the color absorption rate, and the manufacturing process, it is appropriate that the thickness of the color conversion material layer is 15 μm to 30 μm and it is appropriate that the concentration of the color conversion material layer is 30 wt % to 35 wt %.

The color conversion material is discharged onto the display substrate to form the color conversion material layer, and has the same property as the color conversion material layer. Since the liquid color conversion material layer is cured by using ultraviolet UV rays, differences between the liquid color conversion material layer and the cured color conversion material layer in the concentration and the thickness are slight. Even though the cured color conversion material layer 143*m* is patterned with the first color conversion layer 143 or the second color conversion layer 152, there is almost litter change in concentration and thickness.

Further, the concentrations of the first color conversion layer 143 and the second color conversion layer 152 may also be configured differently. For example, in the case of the first color conversion layer 143, by considering the manufacturing process, the concentration may be set to 30 wt % or less and in the case of the second color conversion layer 152, the concentration may be set to 45 wt % or less in order to increase the color absorption rate.

Hereinafter, an overall structure of the display device illustrated in FIGS. 2, 4, and 5 will be described in detail.

The display device according to an example embodiment of the present disclosure includes a display substrate 110 and an LED 130 disposed on the display substrate 110. The display substrate 110 as a substrate supporting components disposed at the upper portion of the display device 100 may be an insulating substrate. For example, the display substrate 110 may be made of a transparent material such as glass or plastic, and also made of a glass or plastic material having flexibility.

A pixel area may be defined on the display substrate 110. The pixel area may include the subpixel area, and the green LED 130*g* or the blue LED 130*b* used as the subpixel may be disposed in each subpixel area or only the blue LED 130*b* may be disposed. Further, the thin-film transistor 120 and various wires for driving each LED 130 may be formed in the subpixel area. The thin-film transistor 120 controls each LED 130, and when the thin-film transistor 120 is turned on, a driving signal input from the outside through the wire is applied to the LED 130 which emits light and implements the image.

The first planarization layer 111 is disposed at the upper portion of the thin-film transistor 120 so as to planarize the upper surface of the thin-film transistor 120. The first planarization layer 111 may be formed to planarize the upper portion in an area where the thin-film transistor 120 is disposed and an area other than a first contact hole. The first planarization layer 111 may be constituted by a single layer or multiple layers of photo acryl, transmissive epoxy, silicon oxide (SiOx), or silicon nitride (SiNx).

The first contact hole for exposing a part of the source electrode 124 of the thin-film transistor 120 and a part of the common wire CL is formed in the first planarization layer 111, and a plurality of connection portions is disposed in the first contact hole. The plurality of connection portions includes a first connection portion 126 and a second connection portion 127. One end of the first connection portion 126 is connected to the source electrode 124 of the thin-film transistor and the other end is connected to the p-type electrode 135 of the LED 130 through a first connection wire 141. One end of the second connection portion 127 is connected to the common wire CL and the other end is connected to the n-type electrode 131 of the LED through a second connection wire 142.

The LED 130 may be disposed on the first planarization layer 111 through the transfer process. The first color conversion layer 143 may be disposed to surround the upper portion and the lateral portion of the LED 130 around the LED 130 requiring color conversion. In addition, for electrical connection of the LED 130, a plurality of second contact holes for exposing the p-type electrode 135 and the n-type electrode 131 of the LED 130 is formed at the upper portion of the first color conversion layer 143.

The second planarization layer 145 may be disposed at the lateral portion of the first color conversion layer 143 and a peripheral portion of the LED 130 where the first color conversion layer 143 is not formed. The second planarization layer 145 may planarize upper surfaces of the LED 130 and the first color conversion layer 143 by filling spaces among all components including the LED 130 formed on the first planarization layer 111. The second planarization layer 111 may be constituted by the single layer or multiple layers of photo acryl, transmissive epoxy, silicon oxide (SiOx), or silicon nitride (SiNx) similarly to the first planarization layer 111.

In addition, a third contact hole is formed in an area where the first connection portion 126 and the second connection portion 127 are located in the second planarization layer 145 to expose the first connection portion 126 and the second connection portion 127.

The first connection wire 141 may be disposed to electrically connect the first connection portion 126 exposed through the third contact hole, and the p-type electrode 135 of the LED, and the second connection wire 142 may be disposed to electrically connect the second connection portion 127 exposed through the third contact hole, and the n-type electrode 131 of the LED 130. Specifically, one end of the first connection wire 141 may be in contact with the p-type electrode 135 of the LED 130, and the other end may be in contact with the first connection portion 126. One end of the second connection wire 142 may be in contact with the n-type electrode 131 of the LED 130, and the other end may be in contact with the second connection portion 127.

In the case of a structure in which the first connection portion 126 and the second connection portion 127 are not formed, the first connection wire 141 may be directly connected to the source electrode 124 of the thin-film transistor 120, and the second connection wire 142 may be directly connected to the common wire CL.

The first black matrix 144 is disposed on a part of each of the first connection wire 141, the second connection wire 142, the second planarization layer 145, and the first color conversion layer 143. The first black matrix 144 may be disposed on a boundary between the LEDs 130 which are the subpixels. The first black matrix 144 may shield light radiated toward another LED 130 among the light emitted from each of the LEDs 130 or reduce color mixture of the light. The first black matrix 144 may be formed by using a photoresist material mixed with a carbon black material and entirely applying the photoresist material onto the display substrate, and through the photolithography process. In addition, in the second black matrix 156 formed in the color conversion substrate 150, a photosensitive polyimide dry film (PID) or an acryl based dry film including the carbon black material may be formed through the lamination process and the photolithography process.

When the first black matrix 144 formed on the second planarization layer 145 is formed at the same height as an upper end height of the first color conversion layer 143, an entire surface may be planarized, so the third planarization layer to be described below may not be formed.

The third planarization layer 146 may be formed to be disposed on the first black matrix 144, the first color conversion layer 143, the first connection wire 141, and the second connection wire 142 to cover the entirety of the upper portion of the display substrate 110.

The third planarization layer 146 is a layer for protecting the LED 130 on the display substrate 110 and facilitating attachment to the color conversion substrate 150 to be described below. The third planarization layer 146 may be constituted by the single layer or multiple layers of photo acryl, transmissive epoxy, silicon oxide (SiOx), or silicon nitride (SiNx), similarly to the first planarization layer 111.

When the entire surface is planarized by the first black matrix 144, the third planarization layer 146 need not be disposed.

The color conversion substrate 150 is disposed on the third planarization layer 146. The color conversion substrate 150 is configured to include a transparent film 157, the second color conversion layer 152, the second black matrix 156, a transparent layer 153, and an adhesive layer 151. The adhesive layer 151 is disposed at the lower portion, and a plurality of second color conversion layers 152 is disposed on the adhesive layer to correspond to positions of the first color conversion layers 143. The transparent film 157 is disposed on the second color conversion layer 152.

The adhesive layer 151 may include optical clear resin (OCR), optically clear adhesive (OCA), or pressure sensitive adhesive (PSA) which has an excellent adhesive strength, and is capable of enhancing visibility.

The color conversion substrate 150 may be manufactured separately from the display substrate 110, and adhered to the third planarization layer 146 by an adhesive layer, and manufactured. It is also possible to directly form the color conversion substrate 150 on the third planarization layer 146 without the adhesive layer 151.

Figure 7A:
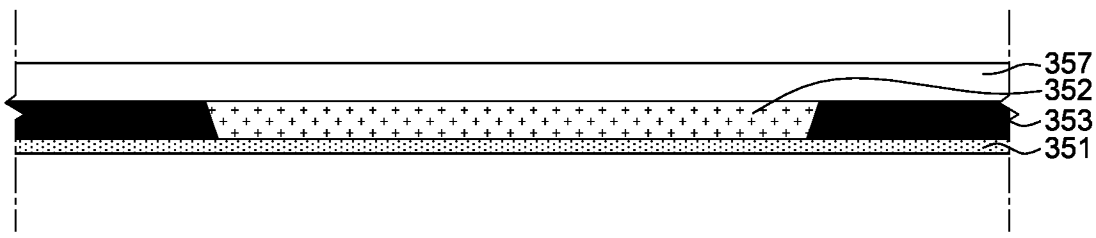
FIG. 7A is a cross-sectional view illustrating a color conversion substrate of a display device according to another example embodiment of the present disclosure.
Figure 7B:
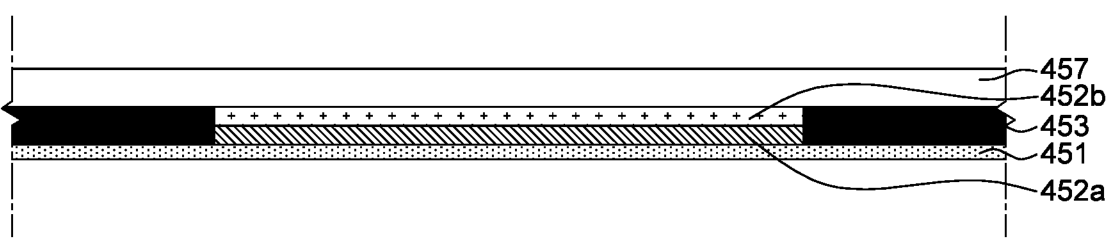
FIG. 7B is a cross-sectional view illustrating a color conversion substrate of a display device according to another example embodiment of the present disclosure.

The second color conversion layer 152 may include the same nano fluorescent body, organic fluorescent body, or quantum dot as the first color conversion layer 143, and may be constituted by a color filter 352 including a pigment or a dye made of a carbon compound as illustrated in FIG. 7A. Since the color filter only serves to absorb light of an unnecessary color differently from the nano fluorescent body, the luminous efficiency may be lowered. Further, as illustrated in FIG. 7B, a color filter layer 452*a* made of the carbon compound and a nano fluorescent body layer 452*b* made of an inorganic material may also be laminated.

Referring to FIGS. 4 and 5, one or more second black matrices 156 and 256 may be disposed between the plurality of second conversion layers 152 and 252. In addition, one or more transparent layers 153 and 253 may be disposed between the plurality of second black matrices 156 and 256. In addition, the transparent films 157 and 257 are disposed on the second color conversion layers 152 and 252, the second black matrices 156 and 256, and the transparent layers 153 and 253.

FIG. 4 illustrates an example embodiment for an entire pixel area including the red subpixel area of FIG. 2.

Referring to FIG. 4, the green LED 130*g* is disposed in the green subpixel area on the first planarization layer 111, and the blue LED 130*b* is disposed in the blue subpixel area and the red subpixel area. The first color conversion layer 143 converting the blue light into the red light is disposed on a circumference of the blue LED 130*b* of the red subpixel area, and the second color conversion layer 152 of the color conversion substrate 150 is disposed to correspond to the first color conversion layer 143. The second color conversion layer 152 converts the blue light into the red light similarly to the first color conversion layer 143.

When the first color conversion layer 143 is not disposed around the green LED 130*g* disposed in the green subpixel area and the blue LED 130*b* disposed in the blue subpixel area, the second color conversion layer 151 is not disposed even in the color conversion substrate 150 and the transparent layer 153 is disposed to correspond to the green LED 130*g* and the blue LED 130*g*.

In addition, the second black matrix 156 of the color conversion substrate 150 is disposed between the second color conversion layer 152 and the transparent layer 153, and between the plurality of transparent layers 153.

FIG. 5 illustrates another example embodiment for the pixel area, and the blue LED 130*b* is disposed in the red subpixel area, the green subpixel area, and the blue subpixel area on the first planarization layer 211. A first red color conversion layer 243*r* converting the blue light into the red light is disposed on the circumference of the blue LED 230*b* of the red subpixel area, and a first green color conversion layer 243*g* converting the blue light into the green light is disposed on the circumference of the blue LED 230*b* of the green subpixel area. In addition, the first color conversion layers 243*r* and 243*g* are not disposed in the blue LED 230*b* disposed in the blue subpixel area, and the transparent layer 253 of the color conversion substrate 250 is disposed to correspond to the blue subpixel area. In respect to disposing of the second color conversion layers 252*r* and 252*g* of the color conversion substrate 250, the second red color conversion layer 252*r* is disposed to correspond to the red subpixel area where the blue LED 230*b* is located and the second green color conversion layer 252*g* is disposed to correspond to the green subpixel area where the blue LED 230*b* is located.

In addition, the second black matrix 156 of the color conversion substrate 150 is disposed between the second red color conversion layer 252*r* and the second green color conversion layer 252*g* and between the transparent layer 153 and the second color conversion layers 252*r* and 252*g*.

Meanwhile, referring to FIGS. 4 and 5, the transparent films 157 and 257 are disposed on the second color conversion layer, the second black matrix, and the transparent layer. The transparent films 157 and 257 may be made of a transparent glass or transparent plastic material, and may be manufactured by a film made of polyethylene terephthalate (PET), polycarbonate (PC), polyethylene naphthalate (PEN), polyimide, and polyacrylate.

Hereinafter, a manufacturing method of the display device 100 according to an example embodiment of the present disclosure will be described in detail with reference to FIGS. 8A to 8H.

FIGS. 8A to 8H are diagrams regarding an example embodiment of converting the blue light emitted from the blue LED 130*b* into the red light. The display device of the example embodiment adopts the blue LED 130*b* and the green LED 130*g*, and is a structure in which the first color conversion layer 143 is formed in some blue LEDs 130*b* to convert and emit the blue light emitted from the blue LED 130*b* into the red light.

Figure 8A:
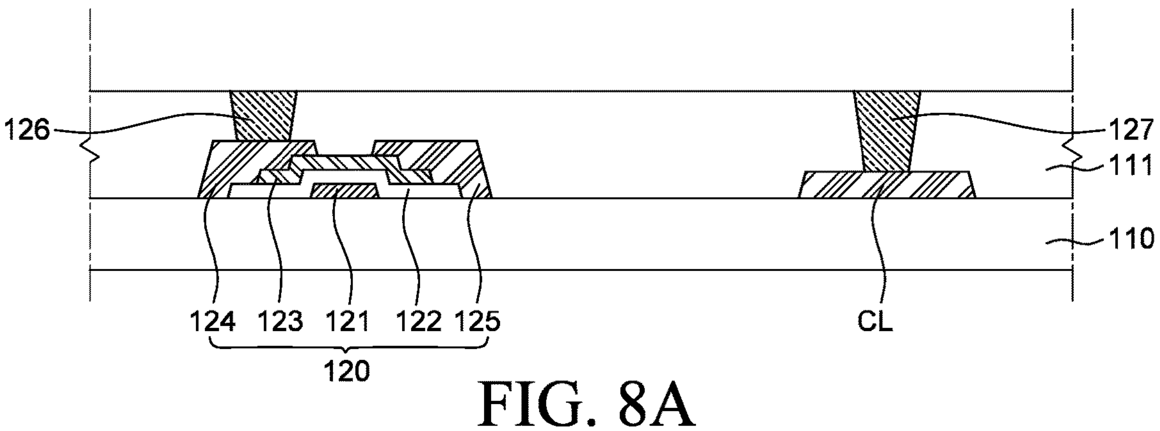
FIGS. 8A to 8H are diagrams illustrating a process of manufacturing a display device according to an example embodiment of the present disclosure.

Referring to FIG. 8A, in order to drive the display device 100, a thin-film transistor TFT is formed on the display substrate 110, which is constituted by the gate electrode 121, the active layer 123, the source electrode 124, and the drain electrode 125. As the thin-film transistor, thin-film transistors 120 having various structures may be formed, such as a thin-film transistor of a bottom gate structure in which the gate electrode 121 is located below the active layer 123 or a thin-film transistor of a top gate structure in which the gate electrode 121 is located above the active layer 123. The common wire CL applying the second power voltage Vdd is made of the same metallic material as the source electrode 124 and the drain electrode 125 in the same order. The first planarization layer 111 for planarizing the surface is formed on the source electrode 124, the drain electrode 125, and the common wire CL.

After the first planarization layer 111 is formed, a plurality of first contact holes for exposing the source electrode 124 and the common wire CL is formed through the photolithography process. The plurality of first contact holes is filled with the conductive material to form the first connection portion 126 and the second connection portion 127. Specifically, as the first connection portion 126 and the second connection portion 127, a single material such as copper (Cu), aluminum (Al), silver (Ag), molybdenum (Mo), chromium (Cr), tantalum (Ta), or titanium (Ti) or a low-resistance opaque conductive material of an alloy in which two materials are combined may be used.

Figure 8B:
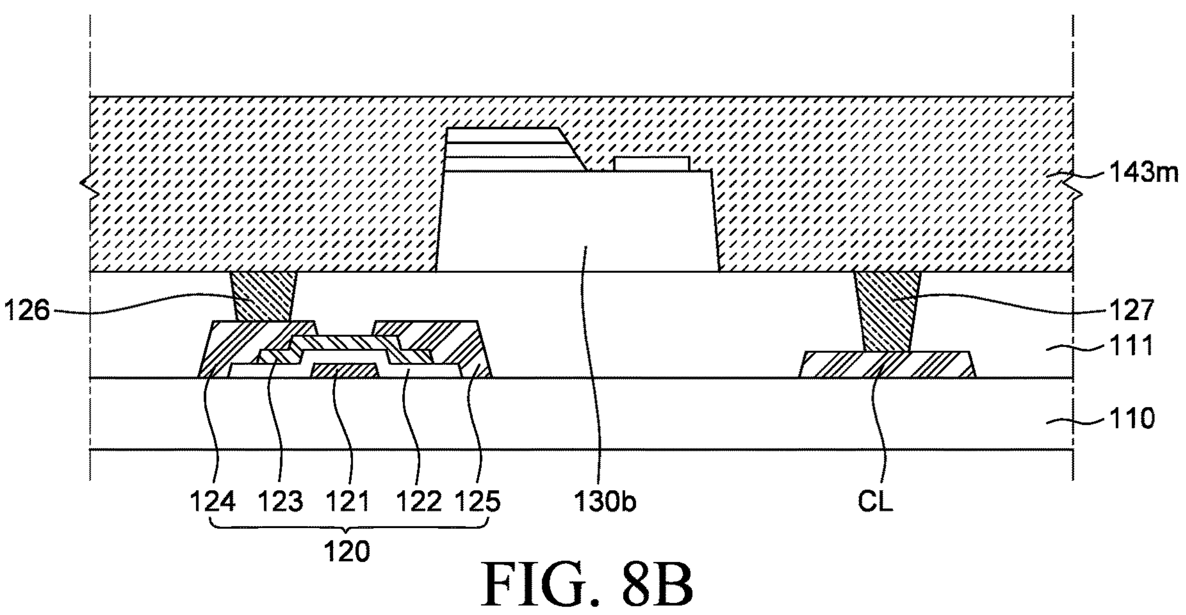

Next, as illustrated in FIG. 8B, the blue LED 130*b* is transferred onto the first insulating layer 111. In order to fix all LEDs 130 including the blue LED 130*b* onto the first insulating layer 111, the adhesive may be used at the lower portion of the LED 130. The LED 130 is fixed, and then an acryl based solution in which the nano fluorescent body is distributed is entirely applied, and cured to form the color conversion material layer 143*m*. The color conversion material layer 143*m* may be formed even by a method for entirely laminating an acryl based dry film in which the nano fluorescent body is distributed.

Figure 8C:
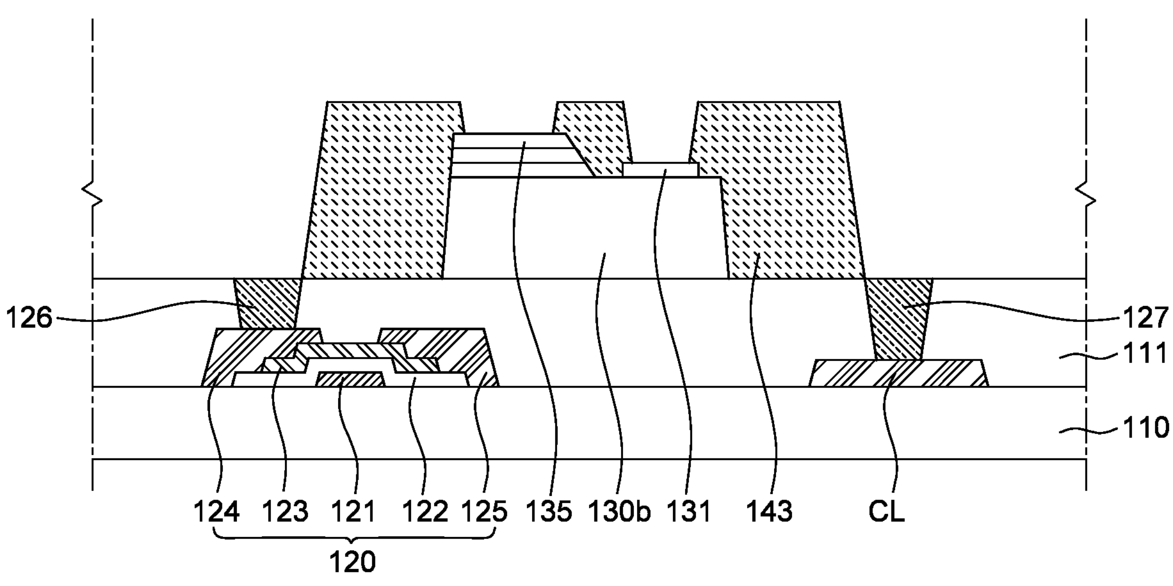

Next, as illustrated in FIG. 8C, a portion of the cured color conversion material layer 143*m*, which surrounds the lateral surface of the blue LED 130*b* is left and the remaining portion is removed through the photolithography process to form the first color conversion layer 143. In addition, the color conversion material layer 143*m* at the upper portions of the p-type electrode 135 and the n-type electrode 131 of the LED 130*b* is also removed to form a second contact hole, and connect the blue LED 130*b* to the first power voltage Vss and the second power voltage Vdd.

Figure 8D:
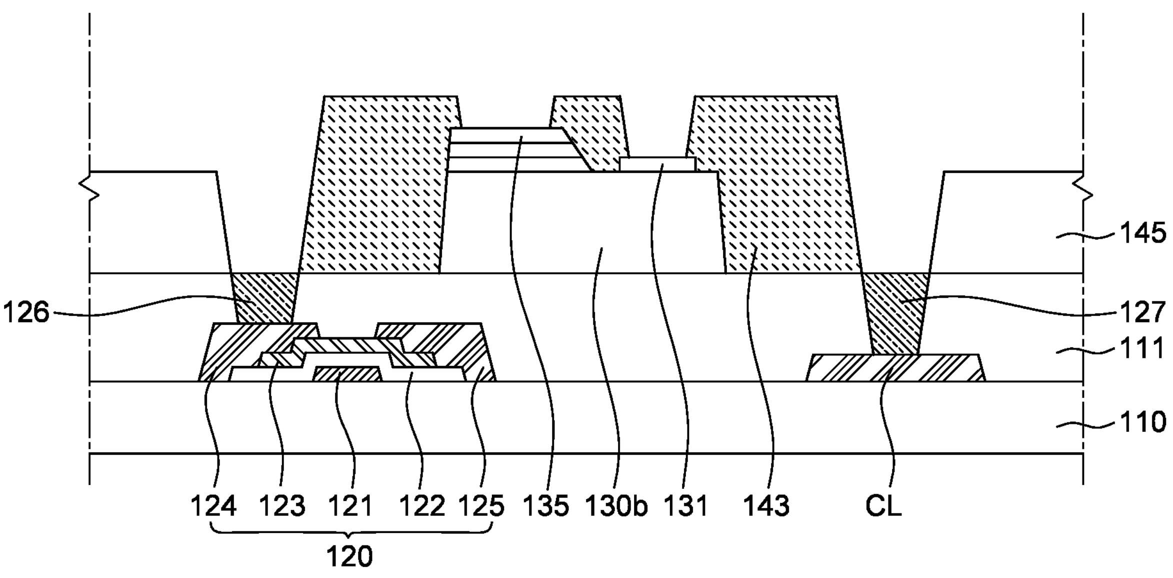

Next, as illustrated in FIG. 8D, after the second planarization layer 145 is formed at the entire upper portion of the first planarization layer 111, the second planarization layer 145 on the first connection portion 126 and the second connection portion 127 is removed to form a third contact hole for exposing the first connection portion 126 and the second connection portion 127. The second planarization layer 145 is formed with a smaller thickness than the first color conversion layer 143 to form the first black matrix 144 to be described below on the second planarization layer 145.

Figure 8E:
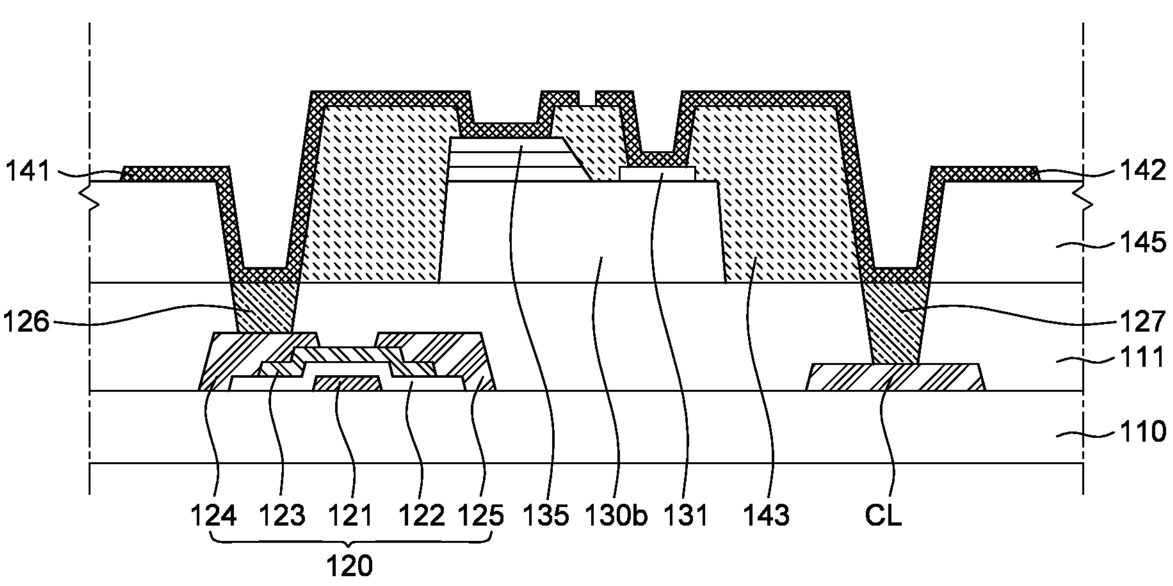

Next, as illustrated in FIG. 8E, the first connection wire 141 and the second connection wire 142 connecting the first connection portion 126 and the second connection portion 127 exposed by removing the second planarization layer 145 to the blue LED 130*b* are formed. Specifically, the first connection wire 141 may be formed to electrically connect the first connection portion 126 exposed through the third contact hole and the p-type electrode 135 of the blue LED 130*b* exposed through the second contact hole, and the second connection wire 142 may be formed to electrically connect the second connection portion 127 exposed through the third contact hole and the n-type electrode 131 of the blue LED 130*b* exposed through the second contact hole. A forming structure of the connection wire may be equally applied to the LEDs 130 including the blue LED 130*b*.

The first connection wire 141 and the second connection wire 142 may be formed through the photolithography process or a lift-off process. The lift-off process is a process in which when the photoresist PR is formed in an area other than a portion where the connection wire is formed, and connection wire metal is formed in an entire area, and then the photoresist is removed, the connection wire metal formed in the photoresist area is removed and the connection wire metal is left in an area where the photoresist is not formed and the connection wire is formed.

Figure 8F:
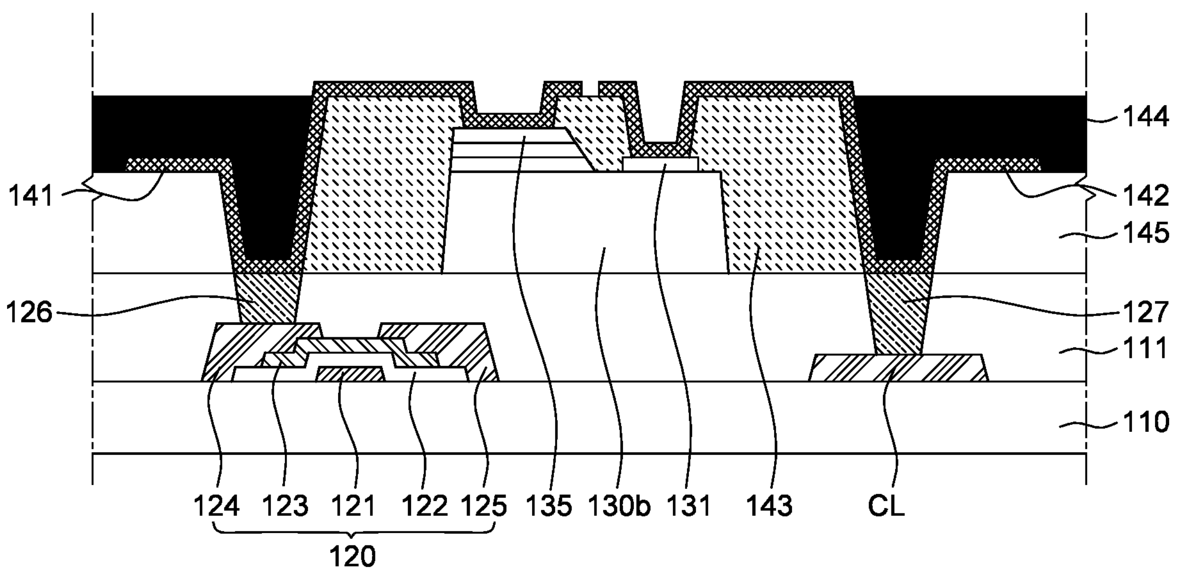

Next, as illustrated in FIG. 8F, the first black matrix 144 is formed on the second planarization layer 145 in which the blue LED 130*b* and the first color conversion layer 143 are not disposed. The first black matrix 144 may be formed by the process such as photolithography, etc., and is formed in the same height as the upper end height of the first color conversion layer 143 to planarize the entire surface. When the surface is planarized by the first black matrix 144, the first black matrix 144 may serve as the third planarization layer 146 to be described below, so the third planarization layer 146 is not required.

The first black matrix 144 is filled even in the third contact hole formed to expose the first connection portion 126 and the second connection portion 127 to serve to planarize the surface and serve to prevent the first connection wire 141 and the second connection wire 142 formed in the third contact hole from being viewed.

Figure 8G:
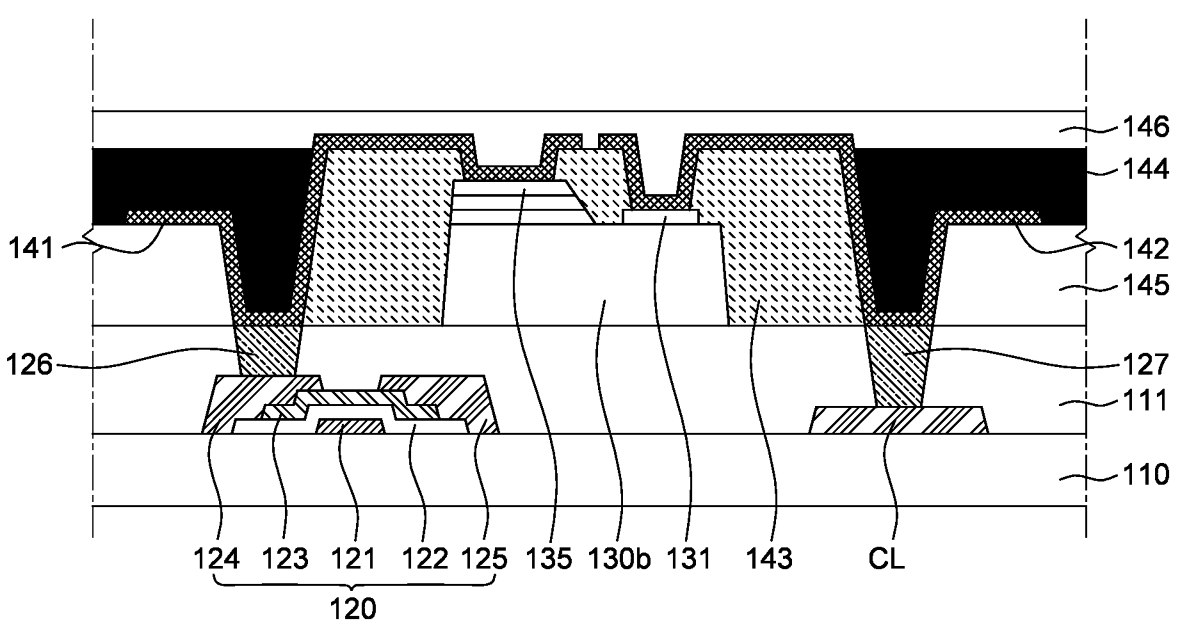

Next, as illustrated in FIG. 8G, the third planarization layer 146 may be formed on the surface where the first black matrix 144 and the first color conversion layer 143 are formed. The third planarization layer 146 may be constituted by photo acryl, transmissive epoxy, silicon oxide (SiOx), or silicon nitride (SiNx). The third planarization layer 146 is formed on the first black matrix 144, the first color conversion layer 143, and the LED 130 to planarize the surface in order to facilitate the attachment of the color conversion substrate 150 to be described below, and when the surface is planarized by the first black matrix 144, the third planarization layer 146 need not be formed.

Figure 8H:
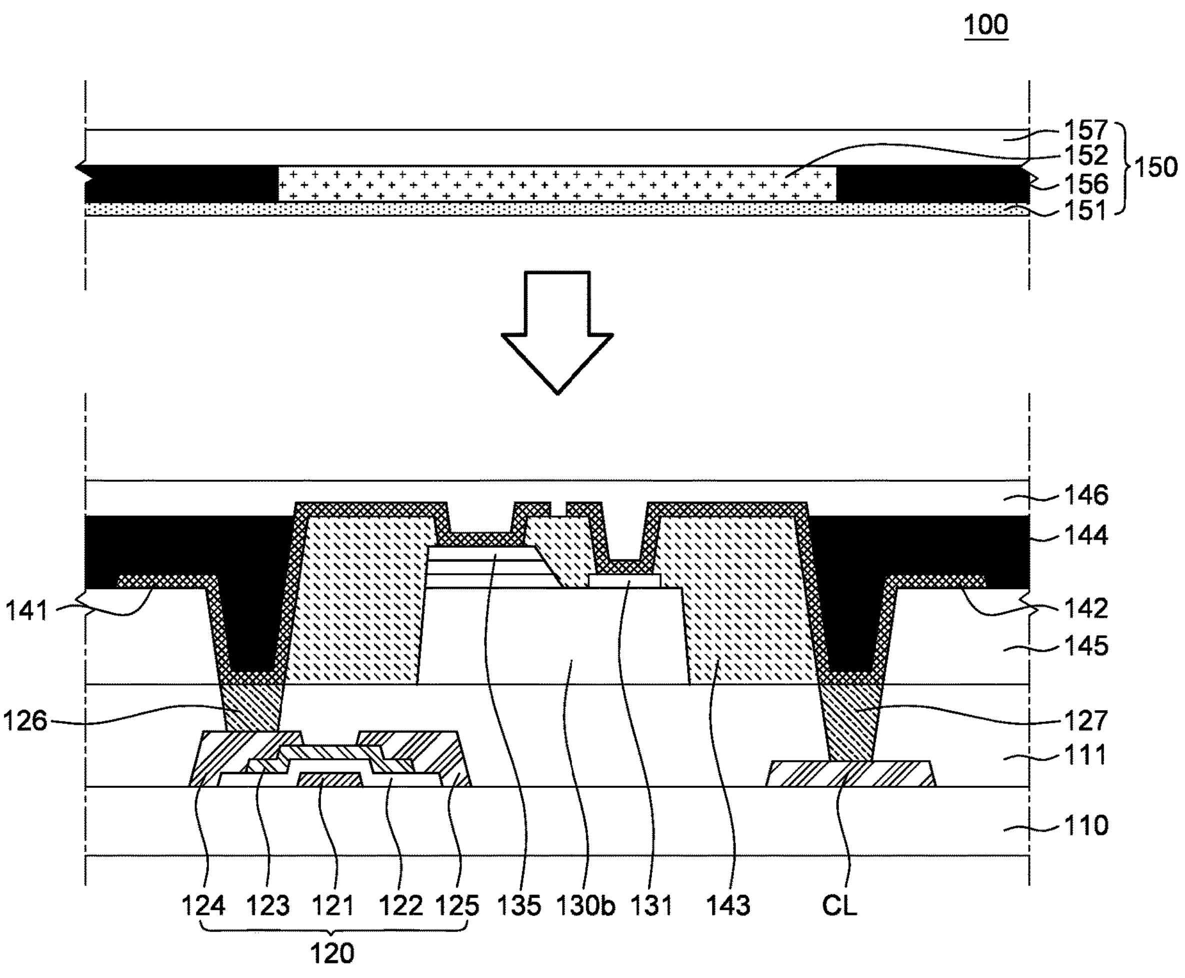

Last, as illustrated in FIG. 8H, the color conversion substrate 150 is attached to the third planarization layer 146 to manufacture the display device 100. In the case of a structure in which the third planarization layer 146 is not formed, the color conversion substrate 150 is attached onto the LED 130, the first color conversion layer 143, and the first black matrix 144 to manufacture the display device.

Further, the color conversion substrate 150 may be manufactured in the order illustrated in FIGS. 9A to 9E.

Figure 9A:
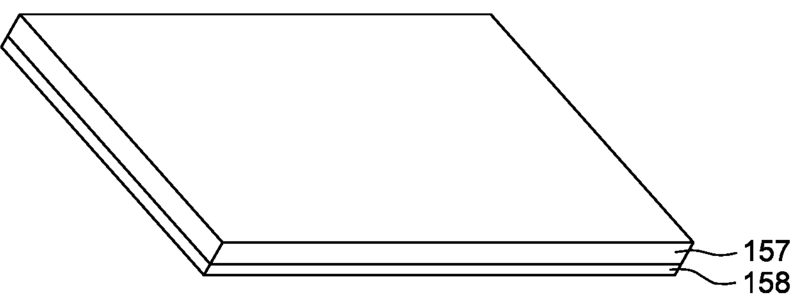
FIGS. 9A to 9E are diagrams illustrating a process of manufacturing a color conversion substrate of a display device according to an example embodiment of the present disclosure.

Referring to FIG. 9A, in order to manufacture the color conversion substrate 150, the transparent film 157 made of the transparent glass or plastic material is attached to a carrier substrate 158 formed by glass or a wafer through lamination in a vacuum environment at an appropriate temperature. The carrier substrate 158 as a substrate temporarily used for manufacturing the color conversion substrate 150 is used for supporting the transparent film, and is separated from the color conversion substrate 150, and removed in a last step.

Figure 9B:
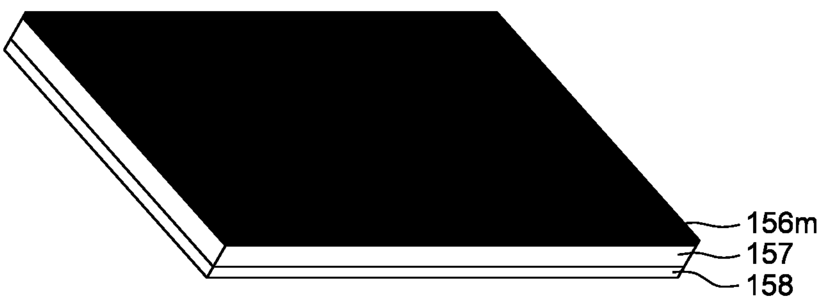

Referring to FIG. 9B, the black matrix film 156*m* made of a photosensitive material is attached onto the transparent film 157 in the vacuum environment at the appropriate temperature.

Figure 9C:
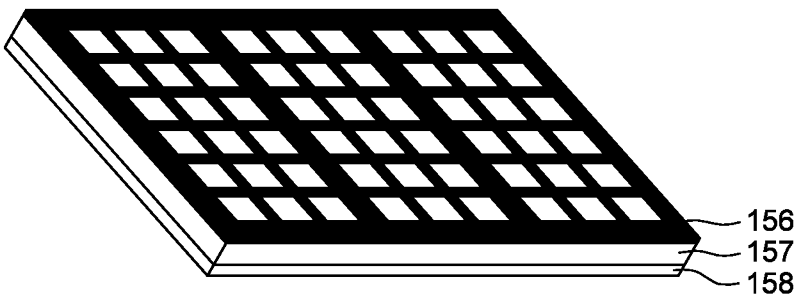

Referring to FIG. 9C, the black matrix film 156*m* made of the photosensitive material, which is attached onto the transparent film 157 is exposed and developed through a mask to form the second black matrix 156 having a partition structure.

Figure 9D:
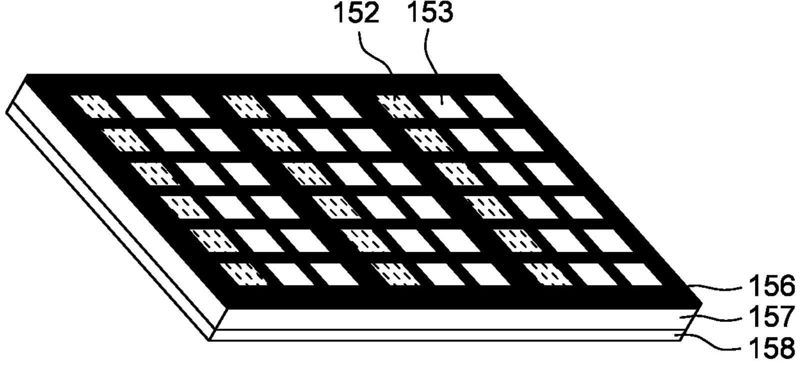

Referring to FIG. 9D, a liquid color conversion material is filled into a space where the second color conversion layer 152 should be located in an empty space between the second black matrices 156 having the partition structure by an inkjet printing process, etc. Specifically, the liquid color conversion material is located in a subpixel area requiring color conversion in response to the first color conversion layer 143, and cured to form the second color conversion layer 152 and an optical curable solution in which a material such as $TiO_2$ is distributed is filled in a subpixel area not requiring the second color conversion layer 152 to form the transparent layer 153.

Figure 9E:
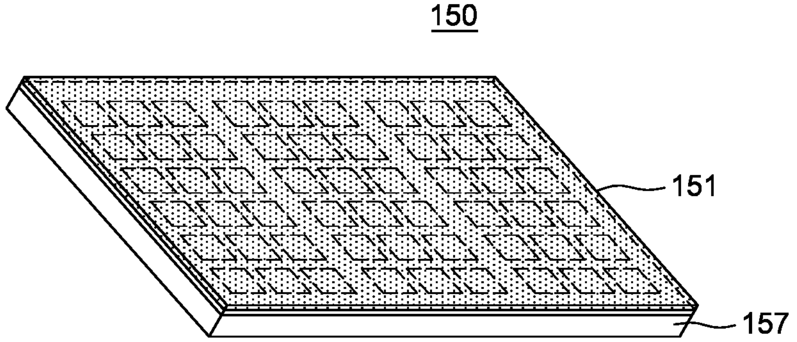

FIG. 9E is a diagram in which the carrier substrate 158 attached to the lower portion of the transparent film 157 is separated, and the adhesive layer 151 such as an optical clear adhesive (OCA) is applied onto the second black matrix 156, the second color conversion layer 152, and the transparent layer 153 at the upper portion of the transparent film 157 to manufacture a final color conversion substrate 150.

The color conversion substrate 150 manufactured through the process has flexibility, so the color conversion substrate 150 may be easily attached onto the display substrate with the LED 130.

In an example embodiment of the present disclosure, the LED 130 may adopt a micro LED or a mini LED. The micro LED and the mini LED may be distinguished according to a size and whether a sapphire substrate used as a growth substrate being removed, and specifically, the size of the LED is 100 μm or less, and an LED of a form in which the growth substrate is removed is categorized into the micro LED, and the size of the LED is hundreds of μm, and an LED of a form in which the growth substrate is not removed is categorized into the mini LED. In addition, a package LED which is commercialized, and used for a general illumination as a structure a size is 500 μm or more, and a fluorescent material is applied to an LED chip is a structure in which a lens may be disposed at the upper portion.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device comprising:

a thin-film transistor on a substrate, the thin-film transistor including an active layer, a gate electrode, a source electrode, and a drain electrode;

a light emitting diode (LED) on the thin-film transistor, the LED including a P-type electrode, an N-type electrode, and a light emitting layer, and the LED electrically connected to the thin-film transistor;

a first color conversion layer surrounding an upper surface and a first lateral surface of the LED and a second lateral surface of the LED opposite the first lateral surface of the LED, the first color conversion layer configured to convert light of a first color emitted from the LED into light of a second color; and a color conversion substrate including a second color conversion layer at a position corresponding to the first color conversion layer.

2. The display device of claim 1, wherein the color conversion substrate includes:

a transparent film at an upper portion of the second color conversion layer, and an adhesive layer at a lower portion of the second color conversion layer.

3. The display device of claim 1, wherein the LED is a blue LED emitting blue light, and the first color conversion layer and the second color conversion layer convert the blue light emitted from the LED into red light or green light.

4. The display device of claim 1, wherein at least one of the first color conversion layer and the second color conversion layer includes a nano fluorescent body comprising an inorganic material, and the nano fluorescent body absorbs light of a specific wavelength emitted from the LED and emits light of another wavelength.

5. The display device of claim 4, wherein the nano fluorescent body comprises an activator configured to perform a light emitting function and a host material accommodating the activator, wherein the activator is at least one of europium (Eu), manganese (Mn), cerium (Ce), terbium (Tb), erbium (Er), strontium (Sr), and scandium (Sc), wherein the host material is at least one of a potassium (K) compound, a strontium (Sr) compound, a calcium (Ca) compound, a silicon (Si) compound, and a gallium (Ga) compound, and a size of the nano fluorescent body is in a range of 100 nm to 1.5 μm.

6. The display device of claim 4, wherein a sum of a thickness of the first color conversion layer located at an upper portion of the light emitting layer of the LED and a thickness of the second color conversion layer is in a range of 15 μm to 30 μm.

7. The display device of claim 4, wherein the nano fluorescent body made of the inorganic material included in at least one of the first color conversion layer and the second color conversion layer is distributed in an acryl based or epoxy based photosensitive material, and a concentration of the nano fluorescent body included in the first color conversion layer and the second color conversion layer is 30 wt % to 35 wt %.

8. The display device of claim 4, wherein the nano fluorescent body made of the inorganic material included in the first color conversion layer is distributed in an acryl based or epoxy based photosensitive material, and a concentration of the nano fluorescent body of the first color conversion layer is 30 wt % or less.

9. The display device of claim 4, wherein the nano fluorescent body made of the inorganic material included in the second color conversion layer is distributed in an acryl based or epoxy based photosensitive material, and a concentration of the nano fluorescent body of the second color conversion layer is 45 wt % or less.

10. The display device of claim 1, wherein at least one of the first color conversion layer and the second color conversion layer is a color filter including a pigment or a dye made of a carbon compound.

11. The display device of claim 1, wherein the second color conversion layer includes a color filter layer made of a carbon compound and a nano fluorescent body layer made of an inorganic material.

12. The display device of claim 1, wherein the color conversion substrate includes a plurality of second color conversion layers, and a black matrix and a transparent layer are disposed between the plurality of second color conversion layers.

13. The display device of claim 1, further comprising:

a planarization layer in an area other than an area where the first color conversion layer and the LED are located; and a first black matrix on the planarization layer.

14. The display device of claim 13, further comprising:

a connection wire electrically connecting the thin-film transistor and the LED through a contact hole formed by partially removing the planarization layer, wherein the connection wire is located between the first color conversion layer and the planarization layer, and located at a lower portion of the first black matrix.

15. The display device of claim 13, wherein the first black matrix is disposed between a side surface of the LED and a side surface of an adjacent LED.

16. A manufacturing method of a display device, comprising:

forming a thin-film transistor including an active layer, a gate electrode, a source electrode, and a drain electrode on a substrate;

transferring a light emitting diode (LED) including a P-type electrode, an N-type electrode, and a light emitting layer onto the thin-film transistor;

covering an upper surface, a first lateral surface, and a second lateral surface of the LED with a first color conversion layer, the second lateral surface of the LED being opposite the first lateral surface of the LED;

forming a planarization layer on a lateral surface of the first color conversion layer;

connecting the source electrode or the drain electrode of the thin-film transistor and the P-type electrode of the LED by a connection wire;

forming a first black matrix on the connection wire; and attaching a color conversion substrate onto the first black matrix and the first color conversion layer.

17. The manufacturing method of a display device of claim 16, wherein covering the LED with the first color conversion layer comprises covering the LED with an acryl based dry film including a nano fluorescent body or applying and curing an acryl based solution including the nano fluorescent body.

18. The manufacturing method of a display device of claim 16, wherein forming the first black matrix comprises:

forming a black matrix material between a side surface of the LED and a side surface of an adjacent LED, on the first color conversion layer, the planarization layer, and the connection wire, and removing the black matrix material on the first color conversion layer.

19. A manufacturing method of a display device, comprising:

forming a thin-film transistor including an active layer, a gate electrode, a source electrode, and a drain electrode on a substrate;

transferring a light emitting diode (LED) including a P-type electrode, an N-type electrode, and a light emitting layer onto the thin-film transistor;

covering the LED with a first color conversion layer;

forming a planarization layer on a lateral surface of the first color conversion layer;

connecting the source electrode or the drain electrode of the thin-film transistor and the P-type electrode of the LED by a connection wire;

forming a first black matrix on the connection wire;

manufacturing a color conversion substrate; and attaching a color conversion substrate onto the first black matrix and the first color conversion layer, wherein manufacturing of the color conversion substrate comprises:

laminating a black matrix film on a transparent film, forming a second black matrix by patterning the laminated black matrix film, forming a second color conversion layer by printing ink including a nano fluorescent body in a space between parts of the patterned second black matrix, and laminating an adhesive layer on the second black matrix and the second color conversion layer.

* * * * *